(12) United States Patent
Iguchi et al.

(10) Patent No.: US 11,539,184 B2
(45) Date of Patent: Dec. 27, 2022

(54) LIGHT-EMITTING DEVICE, OPTICAL DEVICE, AND MEASUREMENT DEVICE

(71) Applicant: FUJIFILM Business Innovation Corp., Tokyo (JP)

(72) Inventors: Daisuke Iguchi, Kanagawa (JP); Kazuhiro Sakai, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 188 days.

(21) Appl. No.: 17/141,183

(22) Filed: Jan. 4, 2021

(65) Prior Publication Data
US 2021/0265809 A1    Aug. 26, 2021

(30) Foreign Application Priority Data

Feb. 26, 2020   (JP) .............................. JP2020-030391

(51) Int. Cl.
| | |
|---|---|
| *H01S 5/026* | (2006.01) |
| *H01S 5/183* | (2006.01) |
| *G01S 17/894* | (2020.01) |
| *G01S 7/4863* | (2020.01) |

(52) U.S. Cl.
CPC ........ *H01S 5/0261* (2013.01); *H01S 5/18302* (2013.01); *G01S 7/4863* (2013.01); *G01S 17/894* (2020.01)

(58) Field of Classification Search
CPC .................................................. H01S 5/18302
USPC .............................................................. 372/9
See application file for complete search history.

(56) References Cited

U.S. PATENT DOCUMENTS

| | | | | |
|---|---|---|---|---|
| 2002/0085256 A1* | 7/2002 | Auracher | ............... | H04B 10/69 398/202 |
| 2009/0263140 A1* | 10/2009 | Kagaya | ................ | H05K 1/0253 398/139 |

FOREIGN PATENT DOCUMENTS

JP    2008252129    10/2008

* cited by examiner

*Primary Examiner* — Tuan N Nguyen
(74) *Attorney, Agent, or Firm* — JCIPRNET

(57) ABSTRACT

A light-emitting device includes a laser unit; and a first capacitive element and a second capacitive element that supply a driving electric current to the laser unit; wherein the first capacitive element has smaller equivalent series inductance than the second capacitive element, and the second capacitive element has a larger capacity and a smaller mount area than the first capacitive element.

20 Claims, 13 Drawing Sheets

LIGHT-EMITTING DEVICE, OPTICAL DEVICE, AND MEASUREMENT DEVICE

CROSS-REFERENCE TO RELATED APPLICATIONS

This application is based on and claims priority under 35 USC 119 from Japanese Patent Application No. 2020-030391 filed Feb. 26, 2020.

BACKGROUND (i) Technical Field

The present disclosure relates to a light-emitting device, an optical device, and a measurement device.

(ii) Related Art

Japanese Unexamined Patent Application Publication No. 2008-252129 describes a light-emitting device including a ceramic substrate having light transmission properties, a light-emitting element mounted on a surface of the ceramic substrate, a wiring pattern for supplying power to the light-emitting element, and a metallization layer made of a metal having light reflectivity, the metallization layer being provided in the ceramic substrate so as to reflect light emitted from the light-emitting element.

SUMMARY

Measurement of a three-dimensional shape of an object to be measured according to a Time of Flight (ToF) method using a flight time of light requires reduced inductance of an electric current path that supplies a driving electric current to a laser unit and fast rising of light emission from the laser unit.

Aspects of non-limiting embodiments of the present disclosure relate to a light-emitting device etc. that can achieve both an improvement in a rising speed of a driving electric current and a reduction in size of the device as compared with a configuration in which a driving electric current is supplied from one kind of capacitive element to a laser unit.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light-emitting device including a laser unit; and a first capacitive element and a second capacitive element that supply a driving electric current to the laser unit; wherein the first capacitive element has smaller equivalent series inductance than the second capacitive element, and the second capacitive element has a larger capacity and a smaller mount area than the first capacitive element.

BRIEF DESCRIPTION OF THE DRAWINGS

An exemplary embodiment of the present disclosure will be described in detail based on the following figures, wherein:

FIG. 4A is a plan view, and FIG. 4B is a cross-sectional view taken along line IVB-IVB of FIG. 4A;

FIG. 6A illustrates an equivalent circuit of the capacitor, and FIG. 6B illustrates frequency characteristics of impedance of the capacitor;

FIG. 7A illustrates a low-ESL capacitor, and FIG. 7B illustrates a non-low-ESL capacitor;

FIG. 9A is a plan view, FIG. 9B is a cross-sectional view taken along line IXB-IXB of FIG. 9A, and FIG. 9C is a cross-sectional view taken along line IXC-IXC of FIG. 9C;

DETAILED DESCRIPTION

Figure 1:
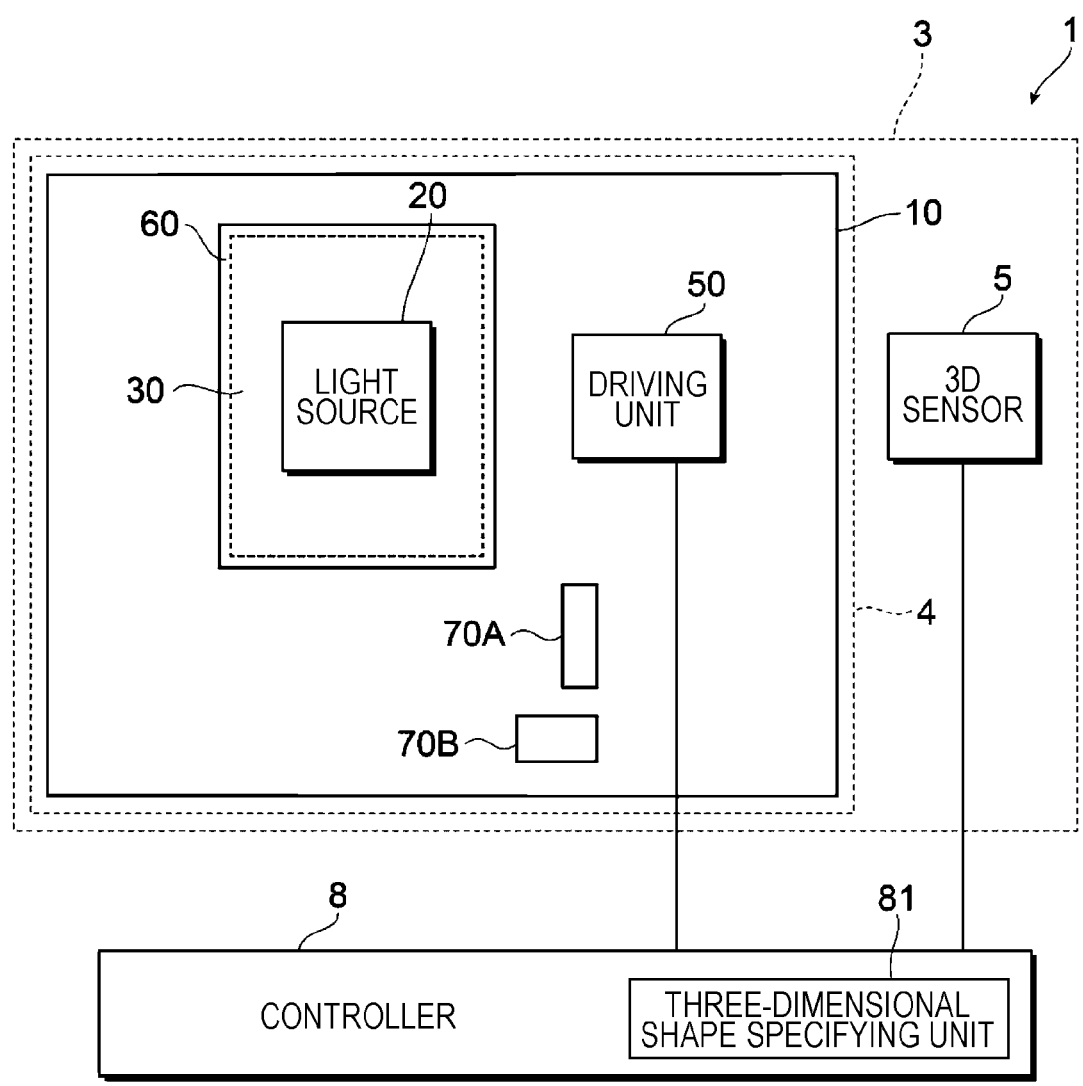
FIG. 1 is a block diagram illustrating an example of a configuration of a measurement device that measures a three-dimensional shape.

An exemplary embodiment of the present disclosure is described in detail below with reference to the attached drawings.

Some measurement devices for measuring a three-dimensional shape of an object to be measured measure a three-dimensional shape according to a Time of Flight (ToF) method using a flight time of light. The ToF method measures a period from a timing of emission of light from a light source of the measurement device to a timing of reception, by a three-dimensional sensor (hereinafter referred to as a 3D sensor) of the measurement device, of light reflected by an object to be measured and specifies a three-dimensional shape of the object to be measured. An object whose three-dimensional shape is to be measured is referred to as an object to be measured. Measurement of a three-dimensional shape may be referred to as three-dimensional measurement, 3D measurement, or 3D sensing.

Such a measurement device is mounted, for example, in a mobile information processing apparatus and is used for face authentication of a user who attempts to access the mobile information processing apparatus. Conventionally, apparatuses such as a mobile information processing apparatus authenticate a user, for example, by using a password, a fingerprint, or an iris. Recently, there are demands for an authentication method of higher security. In response to such demands, recent mobile information processing apparatuses include a measurement device for measuring a three-dimensional shape. That is, a recent mobile information processing apparatus acquires a three-dimensional image of a face of a user who accessed the mobile information processing apparatus, determines whether or not the user has access permission, and permits the user to use the mobile information processing apparatus only in a case where the user is authenticated as a user having access permission.

Furthermore, such a measurement device is also applied to a case where a three-dimensional shape of an object to be measured is continuously measured (e.g., augmented reality (AR)).

A measurement device that measures a three-dimensional shape according to the ToF method is required to be short in rise time of light emission from a laser unit (hereinafter referred to as a light source). The rise time is a time it takes for light to reach a predetermined light amount from the start of light emission. A shorter rise time of light emission from a light source means higher accuracy of measurement. A rise time of light emission from a light source becomes shorter as inductance of a driving circuit that supplies a driving current for driving the light source becomes smaller. That is, as the inductance of the driving circuit that supplies the driving current becomes larger, a driving current of a high frequency becomes harder to flow, and a rise time of light emission from the light source becomes longer accordingly. Note that the rise time may be referred to as a rising speed, and a short rise time may be referred to as fast rising.

Configurations, functions, methods, and the like described in the exemplary embodiment below can be applied to measurement of a three-dimensional shape of an object to be measured other than face authentication and augmented reality.

Measurement Device 1

FIG. 1 is a block diagram illustrating an example of a configuration of a measurement device 1 that measures a three-dimensional shape.

The measurement device 1 includes an optical device 3 and a controller 8. The controller 8 controls the optical device 3. The controller 8 includes a three-dimensional shape specifying unit 81 that specifies a three-dimensional shape of an object to be measured. The controller 8 is a computer including a CPU, a ROM, and a RAM. Examples of the ROM include a non-volatile rewritable memory such as a flash memory. Programs and constant numbers accumulated in the ROM are loaded into the RAM, and the CPU executes the programs. This realizes the three-dimensional shape specifying unit 81 that specifies a three-dimensional shape of an object to be measured.

These members are described below in order.

The optical device 3 includes a light-emitting device 4 and a 3D sensor 5.

The light-emitting device 4 includes a wiring board 10, a light source 20, a light diffusion member 30, a driving unit 50, a holding unit 60, and capacitors 70A and 70B. The capacitor 70A is a capacitor (hereinafter referred to as a low-ESL capacitor) having low equivalent series inductance (ESL), and the capacitor 70B is a capacitor (hereinafter referred to as a non-low-ESL capacitor) having larger equivalent series inductance (ESL) than the capacitor 70A. Although a single capacitor 70A and a single capacitor 70B are illustrated in FIG. 1, either the number of capacitors 70A or the number of capacitors 70B or both of the number of capacitors 70A and the number of capacitors 70B may be more than one. The light-emitting device 4 may include a circuit component such as other capacitors and resistive elements for causing the driving unit 50 to operate. In a case where the capacitors 70A and 70B are not distinguished from each other, the capacitors 70A and 70B are referred to as capacitors 70 or capacitors. The capacitors (the low-ESL capacitor and the non-low-ESL capacitor) will be described later. The capacitors may be referred to as capacitive elements. The capacitor 70A is an example of a first capacitive element, and the capacitor 70B is an example of a second capacitive element.

The light source 20, the driving unit 50, the capacitors 70A and 70B, and the holding unit 60 are provided on a front surface of the wiring board 10. Although the 3D sensor 5 is not provided on the front surface of the wiring board 10 in FIG. 1, the 3D sensor 5 may be provided on the front surface of the wiring board 10. The light diffusion member 30 is provided on the holding unit 60. The "front surface" as used herein refers to a front side of the paper on which FIG. 1 is drawn. More specifically, a side of the wiring board 10 on which the members such as the light source 20 are provided is referred to as a front surface, a front side, or a front surface side.

The light source 20 is a surface emitting laser element array including plural surface emitting laser elements that are two-dimensionally arranged (see FIG. 2, which will be described later). The surface emitting laser elements are, for example, vertical cavity surface emitting lasers (VCSELs). In the following description, it is assumed that the surface emitting laser elements are vertical cavity surface emitting lasers (VCSELs). The vertical cavity surface emitting lasers (VCSELs) are hereinafter referred to as VCSELs. Since the light source 20 is provided on the front surface of the wiring board 10, the light source 20 emits light toward an outside in a direction perpendicular to the front surface of the wiring board 10. The light source 20 is an example of a laser unit.

The light diffusion member 30 diffuses incident light emitted from the light source 20 and outputs the diffused light. The light diffusion member 30 is provided so as to cover the light source 20. Specifically, the light diffusion member 30 is provided so as to be spaced apart by a predetermined distance from the light source 20 provided on the wiring board 10 by the holding unit 60 provided on the front surface of the wiring board. Accordingly, light emitted from the light source 20 reaches an object to be measured after being diffused by the light diffusion member 30. That is, the light emitted by the light source 20 is radiated in a wider range by being diffused by the light diffusion member 30 than in a case where the light diffusion member 30 is not provided.

In a case where three-dimensional measurement is performed by using the ToF method, the light source 20 is required to emit, for example, pulsed light (hereinafter referred to as an emitted light pulse) of 100 MHz or more whose rise time is 1 ns or less by the driving unit 50. That is, the light source 20 emits an emitted light pulse by being driven by a driving electric current pulse supplied from the driving circuit that drives the light source 20. In an example of face authentication, a distance over which light is radiated is approximately 10 cm to approximately 1 m, and a range irradiated with light is approximately 1 m square. The distance over which light is radiated is referred to as a measurement distance, and the range irradiated with light is referred to as an irradiation range or a measurement range. A plane virtually provided in the irradiation range or the measurement range is referred to as an irradiation plane. In cases other than face authentication, the measurement distance to the object to be measured and the irradiation range of the object to be measured may be different from those described above.

The 3D sensor 5 includes plural light receiving cells and outputs a signal corresponding to a period from emission of light from the light source 20 to reception of the light by the 3D sensor 5. For example, each of the light receiving cells of the 3D sensor 5 receives pulsed light (hereinafter referred to as a received pulse) that is an emitted pulse from the light source 20 reflected by an object to be measured and accumulates an electric charge corresponding to a period to the reception of the light. The 3D sensor 5 is a device having a CMOS structure in which each light receiving cell includes two gates and electric charge accumulating units corresponding to the two gates. By alternately applying a pulse to the two gates, a generated photoelectron is transferred to any of the two electric charge accumulating units at a high speed. In the two electric charge accumulating units, an electric charge according to a phase difference between an emitted light pulse and a received pulse is accumulated. The 3D sensor 5 outputs, as a signal for each light receiving cell, a digital value according to a phase difference between an emitted light pulse and a received pulse through an AD converter. That is, the 3D sensor 5 outputs a signal corresponding to a period from emission of light from the light source 20 to reception of the light by the 3D sensor 5. Accordingly, a signal corresponding to a three-dimensional shape of the object to be measured is acquired from the 3D sensor 5. It is therefore required that a rise time of the emitted light pulse be short and a rise time of the received pulse be short. That is, it is required that a rise time of a driving electric current pulse supplied to drive the light source 20 be short. The AD converter may be provided in the 3D sensor 5 or may be provided outside the 3D sensor 5. The 3D sensor 5 is an example of a light receiving unit.

The three-dimensional shape specifying unit 81 of the controller 8 acquires a digital value obtained for each light receiving cell and calculates a distance to the object to be measured for each light receiving cell in a case where the 3D sensor 5 is, for example, a device having a CMOS structure as described above. Then, the three-dimensional shape specifying unit 81 specifies a three-dimensional shape of the object to be measured based on the calculated distance and outputs the specified three-dimensional shape.

As described above, the controller 8 is a computer, and the three-dimensional shape specifying unit 81 is realized by a program. However, these members may be realized by an integrated circuit such as an ASIC or an FPGA. Alternatively, these members may be realized by software such as a program and an integrated circuit such as an ASIC.

As described above, the measurement device 1 diffuses light emitted from the light source 20, irradiates an object to be measured with the diffused light, and causes the 3D sensor 5 to receive the light reflected by the object to be measured. In this way, the measurement device 1 measures a three-dimensional shape of the object to be measured.

Although the optical device 3 and the controller 8 are separately illustrated in FIG. 1, the optical device 3 and the controller 8 may be integral with each other.

First, the light source 20, the light diffusion member 30, the driving unit 50, and the capacitors (the capacitors 70A and 70B) that constitute the light-emitting device 4 are described.

Configuration of Light Source 20

Figure 2:
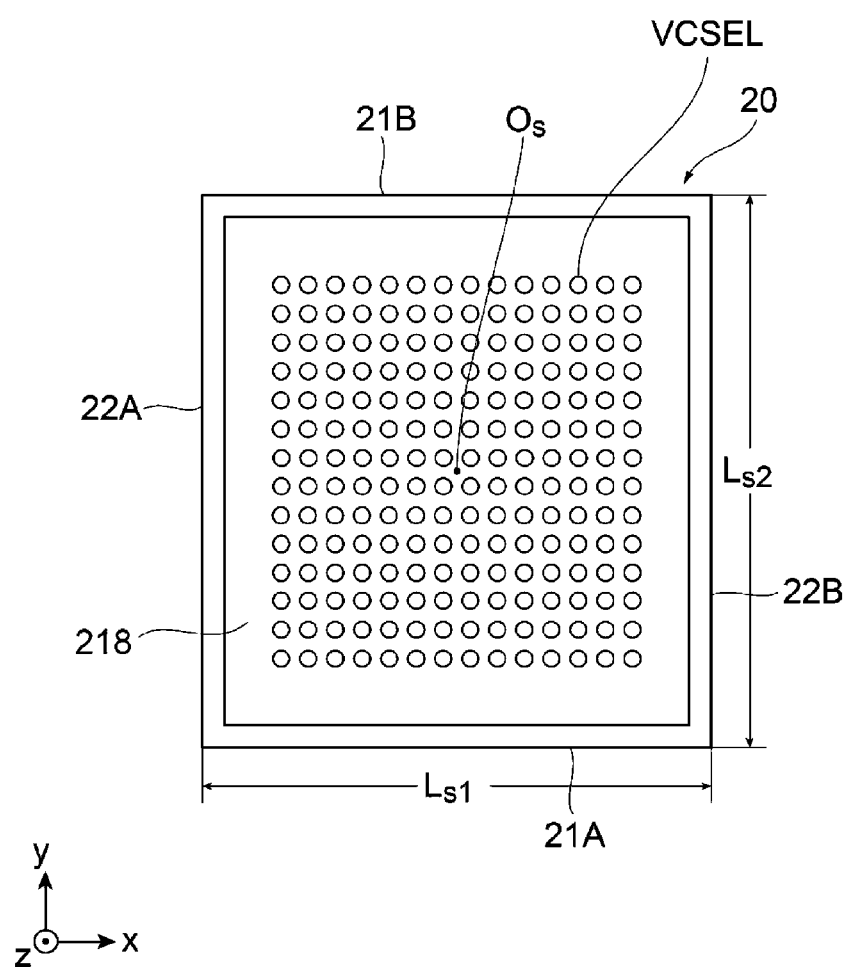
FIG. 2 is a plan view of a light source.

FIG. 2 is a plan view of the light source 20. It is assumed that the rightward direction and the upward direction of the paper on which FIG. 2 is drawn are an x direction and a y direction, respectively. A direction orthogonal to the x direction and the y direction in anticlockwise direction is a z direction. Note that the front surface of the light source 20 is a front side of the paper on which FIG. 2 is drawn, that is, a surface on a +z direction side, and a rear surface of the light source 20 is a rear side of the paper on which FIG. 2 is drawn, that is, a surface on a −z direction side. The plan view of the light source 20 is a view illustrating the light source 20 from the front surface side. More specifically, a side of the light source 20 on which an epitaxial layer functioning as a light emission layer (an active region 206, which will be described later) is provided is referred to as a front surface, a front side, or a front surface side of the light source 20.

As described above, the light source 20 is a surface emitting laser element array using VCSELs as surface emitting laser elements. That is, the light source 20 is configured such that plural VCSELs are disposed in a two-dimensional array when viewed from the front surface side, as illustrated in the plan view of FIG. 2. Although the VCSELs are arranged on grid points arranged in a square shape in FIG. 2, the VCSELs may be arranged in a different manner.

Each of the VCSELs is a surface emitting laser element configured such that an active region that serves as a light-emitting region is provided between a lower multilayer film reflector and an upper multilayer film reflector stacked on a semiconductor substrate 200 (see FIG. 3, which will be described later) and emits laser light in a direction perpendicular to a surface of the semiconductor substrate 200. It is therefore easier to arrange the VCSELs in a two-dimensional array than in a case where end-surface emission type lasers are used. The number of VCSELs included in the light source 20 is, for example, 100 to 1000. The plural VCSELs are connected in parallel and are driven in parallel. The number of VCSELs described above is an example and need just be set in accordance with the measurement distance and the irradiation range.

It is assumed here that the light source 20 is configured such that a shape thereof (hereinafter referred to as a planar shape) viewed from the front surface side is quadrangular (sometimes referred to as a quadrangular shape). A side surface on a −y direction side, a side surface on a +y direction side, a side surface on a −x direction side, and a side surface on a +x direction side are referred to as a side surface 21A, a side surface 21B, a side surface 22A, and a side surface 22B, respectively. The side surface 21A and the side surface 21B face each other. The side surface 22A and the side surface 22B connect the side surface 21A and the side surface 21B and face each other. The light source 20 is configured such that a length of a side in the x direction (a length of the side surfaces 21A and 21B) is $L_s1$ and a length of a side in the y direction (a length of the side surfaces 22A and 22B) is $L_s2$. The planar shape of the light source 20 may be a square shape whose lengths $L_s1$ and $L_s2$ are the same as each other or may be a rectangular shape whose lengths $L_s1$ and $L_s2$ are different from each other. The lengths $L_s1$ and $L_s2$ of the light source 20 depend on the number of VCSELs of the light source 20, intervals at which the VCSELs are disposed, and the like and are, for example, 0.5 mm to 2 mm (e.g., 1 mm). A center (a center in the x direction and the y direction) of the planar shape of the light source 20 is set as a center $O_s$ of the light source 20. The planar shape of the light source 20 may be a shape other than a quadrangular shape.

An anode electrode 218 common to the plural VCSELs is provided on the front surface of the light source 20. A cathode electrode 214 is provided on a rear surface of the light source 20 (see FIG. 3, which will be described later). That is, the plural VCSELs are connected in parallel. In a case where the plural VCSELs are connected in parallel and driven in parallel, light of a higher intensity is emitted than in a case where the VCSELs are individually driven.

Structure of VCSEL

Figure 3:
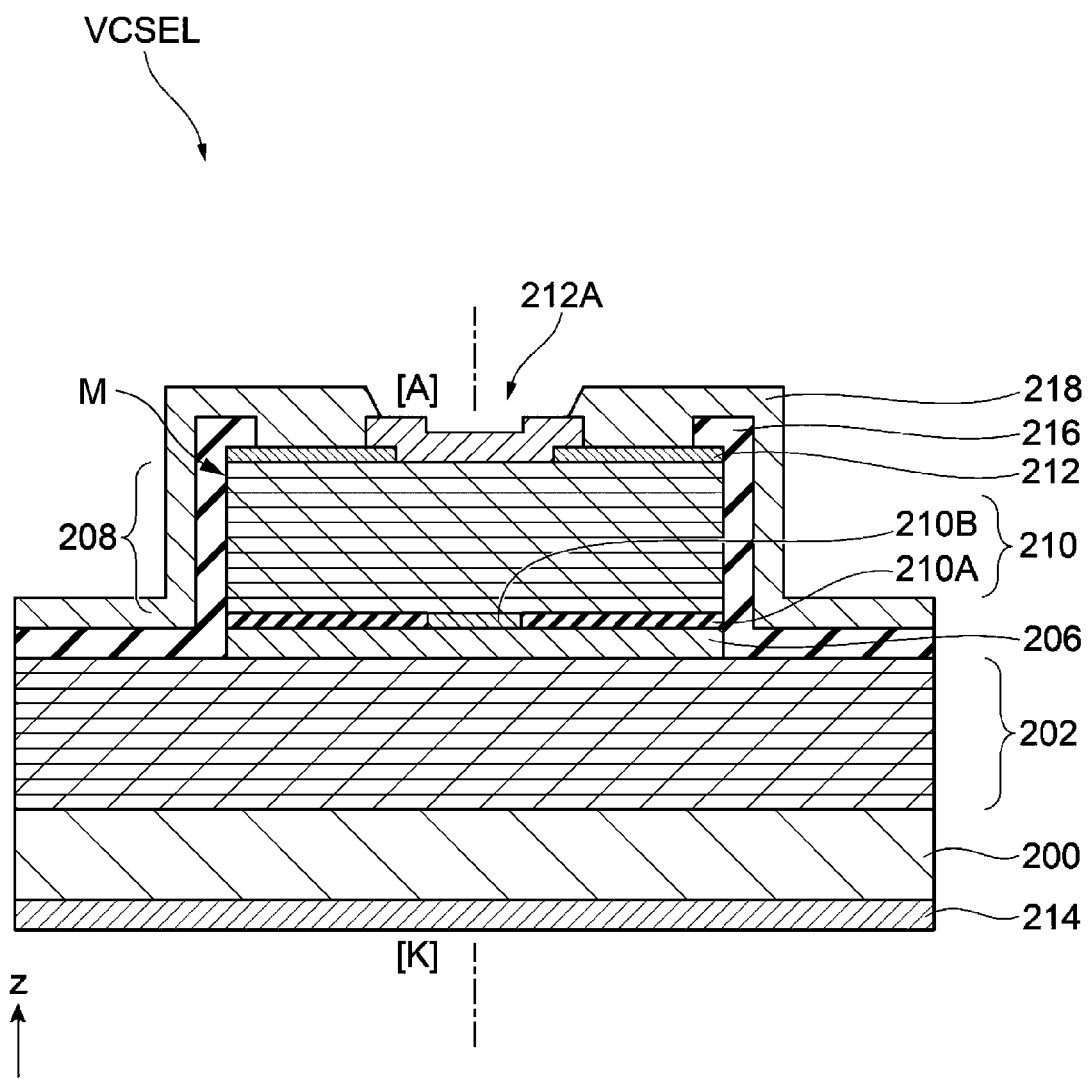
FIG. 3 is a view for explaining an example of a cross-sectional structure of a single VCSEL of the light source.

FIG. 3 is a view for explaining an example of a cross-sectional structure of a single VCSEL in the light source 20. The VCSEL is a VCSEL having a λ resonator structure. The upward direction of the paper on which FIG. 3 is drawn is the z direction, and a +z direction is referred to as an upper side, and a −z direction is referred to as a lower side.

The VCSEL is configured such that an n-type lower distributed bragg reflector (DBR) 202 in which AlGaAs layers having different Al compositions are alternately stacked, an active region 206 including a quantum well layer sandwiched between an upper spacer layer and a lower spacer layer, and a p-type upper distributed bragg reflector 208 in which AlGaAs layers having different Al compositions are alternately stacked are stacked in order on the semiconductor substrate 200 such as n-type GaAs. Hereinafter, a distributed bragg reflector is referred to as a DBR.

The n-type lower DBR 202 is a multilayer body including pairs of an $Al_{0.9}Ga_{0.1}As$ layer and an GaAs layer, each of the layers has a thickness of $\lambda/4n_r$ ($\lambda$ is an oscillation wavelength, and $n_r$ is a refractive index of a medium), and 40 pairs of these layers are stacked so that these layers are alternately provided. The n-type lower DBR 202 is doped with silicon (Si), which is an n-type impurity, as a carrier. A carrier concentration is, for example, $3\times10^{18}$ $cm^{-3}$.

The active region 206 is configured such that the lower spacer layer, the quantum well active layer, and the upper spacer layer are stacked. For example, the lower spacer layer is an undoped $Al_{0.6}Ga_{0.4}As$ layer, the quantum well active layer is an undoped InGaAs quantum well layer and an undoped GaAs barrier layer, and the upper spacer layer is an undoped $Al_{0.6}Ga_{0.4}As$ layer.

The p-type upper DBR 208 is a multilayer body including pairs of a p-type $Al_{0.9}Ga_{0.1}As$ layer and a GaAs layer. Each of the layers of the p-type upper DBR 208 has a thickness of $\lambda/4n_r$, and 29 pairs of these layers are stacked so that these layers are alternately provided. The p-type upper DBR 208 is doped with carbon (C), which is a p-type impurity, as a carrier. A carrier concentration is, for example, $3\times10^{18}$ $cm^{-3}$. Desirably, a contact layer made of p-type GaAs is formed in a topmost layer of the upper DBR 208, and a p-type AlAs current confinement layer 210 is formed in a lowermost layer of the upper DBR 208 or in an inner part of the upper DBR 208.

By etching a semiconductor layer stacked from the upper DBR 208 to the lower DBR 202, a cylindrical mesa M is formed on the semiconductor substrate 200. This causes the current confinement layer 210 to be exposed on a side surface of the mesa M. An oxidized region 210A oxidized from the side surface of the mesa M and an electrically-conductive region 210B surrounded by the oxidized region 210A are formed in the current confinement layer 210 by an oxidation process. In the oxidation process, an oxidation speed of the AlAs layer is higher than an oxidation speed of the AlGaAs layer, and the oxidized region 210A is oxidized from the side surface of the mesa M toward an inside of the mesa M at an almost constant speed, and therefore a cross-sectional shape of the electrically-conductive region 210B becomes a shape reflecting an external shape of the mesa M, i.e., a circular shape, and a center of the shape almost matches an axis (indicated by the line with alternate long and short dashes) of the mesa M. In the present exemplary embodiment, the mesa M has a columnar structure.

An annular p-side electrode 212 made of a metal in which Ti/Au and the like are stacked is formed in a topmost layer of the mesa M. The p-side electrode 212 makes ohmic-contact with the contact layer provided in the upper DBR 208. An inner side of the annular p-side electrode 212 serves as a light outlet 212A through which laser light is emitted to an outside. That is, the VCSEL emits light in a +z direction perpendicular to a front surface (a surface on the +z direction side) of the semiconductor substrate 200. The axis of the mesa M is an optical axis. Furthermore, the cathode electrode 214 is formed as an n-side electrode on the rear surface of the semiconductor substrate 200. Note that a front surface (a surface on the +z direction side) of the upper DBR 208 on an inner side of the p-side electrode 212 is a light emission surface.

An insulating layer 216 is provided so as to cover the front surface of the mesa M excluding a part of the p-side electrode 212 to which the anode electrode 218 is connected and the light outlet 212A. The anode electrode 218 is provided so as to make ohmic-contact with the p-side electrode 212 excluding the light outlet 212A. The anode electrode 218 is provided common to the plural VCSELs. That is, the p-side electrodes 212 of the plural VCSELs that constitute the light source 20 are connected in parallel by the anode electrode 218.

In FIG. 3, the anode electrode 218 is indicated by [A] indicative of an anode, and the cathode electrode 214 is indicated by [K] indicative of a cathode.

The VCSEL may oscillate in a single transverse mode or may oscillate in a multiple transverse mode. Light output of a single VCSEL is, for example, 4 mW to 8 mW. Accordingly, for example, in a case where the light source 20 is constituted by 500 VCSELs, light output of the light source 20 is 2 W to 4 W.

Configuration of Light Diffusion Member 30

Figure 4A:
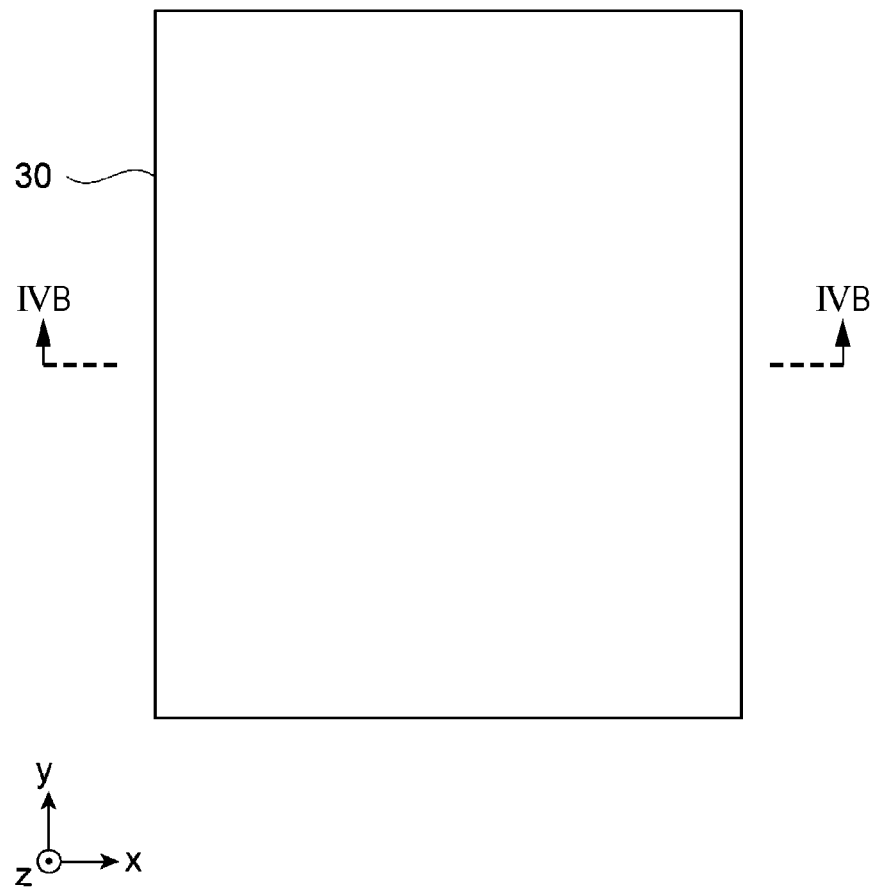
FIGS. 4A and 4B are views for explaining an example of a light diffusion member.
Figure 4B:
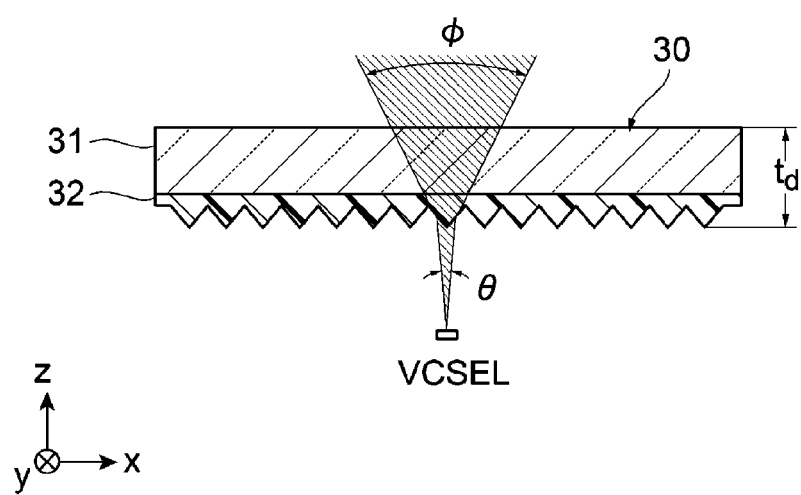

FIGS. 4A and 4B are views for explaining an example of the light diffusion member 30. FIG. 4A is a plan view, and FIG. 4B is a cross-sectional view taken along line IVB-IVB of FIG. 4A. In FIG. 4A, it is assumed that the rightward direction and the upward direction of the paper on which FIG. 4A is drawn are the x direction and the y direction, respectively. It is assumed that a direction orthogonal to the x direction and the y direction in anticlockwise direction is the z direction. A surface of the light diffusion member 30 on the +z direction side is referred to as a front surface or a front surface side, and a surface of the light diffusion member 30 on the −z direction side is referred to as a rear surface or a rear surface side. Accordingly, in FIG. 4B, the rightward direction, the depth direction, and the upward direction of the paper on which FIG. 4B is drawn are the x direction, the y direction, and the z direction, respectively.

As illustrated in FIG. 4B, the light diffusion member 30 includes a resin layer 32 having irregularities for diffusing light, for example, on a rear surface (−z direction) side of a glass substrate 31 whose both surfaces are parallel and flat. The light diffusion member 30 widens a spread angle of light incident from the VCSELs of the light source 20. That is, the irregularities of the resin layer 32 of the light diffusion member 30 refract and scatter light so that incident light is output as light having a wider spread angle. That is, as illustrated in FIG. 4B, the light diffusion member 30 causes light having a spread angle θ emitted from the VCSELs and incident from the rear surface (−z direction side) to be output as light having a spread angle φ, which is larger than θ, from the front surface (+z direction side) (θ<φ). This means that use of the light diffusion member 30 increases an area of an irradiation surface irradiated with light emitted from the light source 20 as compared with a case where the light diffusion member 30 is not used. The spread angles θ and φ are full width at half maximum (FWHM).

The light diffusion member 30 is, for example, configured such that a planar shape thereof is a quadrangle and a thickness $t_d$ (a thickness in the z direction) thereof is 0.1 mm to 1 mm. The planar shape of the light diffusion member 30 may be any of other shapes such as a polygonal shape or a circular shape.

Driving Unit 50 and Capacitors 70A and 70B

In a case where the light source 20 is driven at a higher speed, the light source 20 is desirably driven by low-side driving. The low-side driving refers to a configuration in which a driving element such as an MOS transistor is located on a downstream side of a path through which an electric current flows (hereinafter referred to as an electric current path) relative to a target to be driven such as a VCSEL. Conversely, a configuration in which a driving element is located on an upstream side is referred to as high-side driving.

Figure 5:
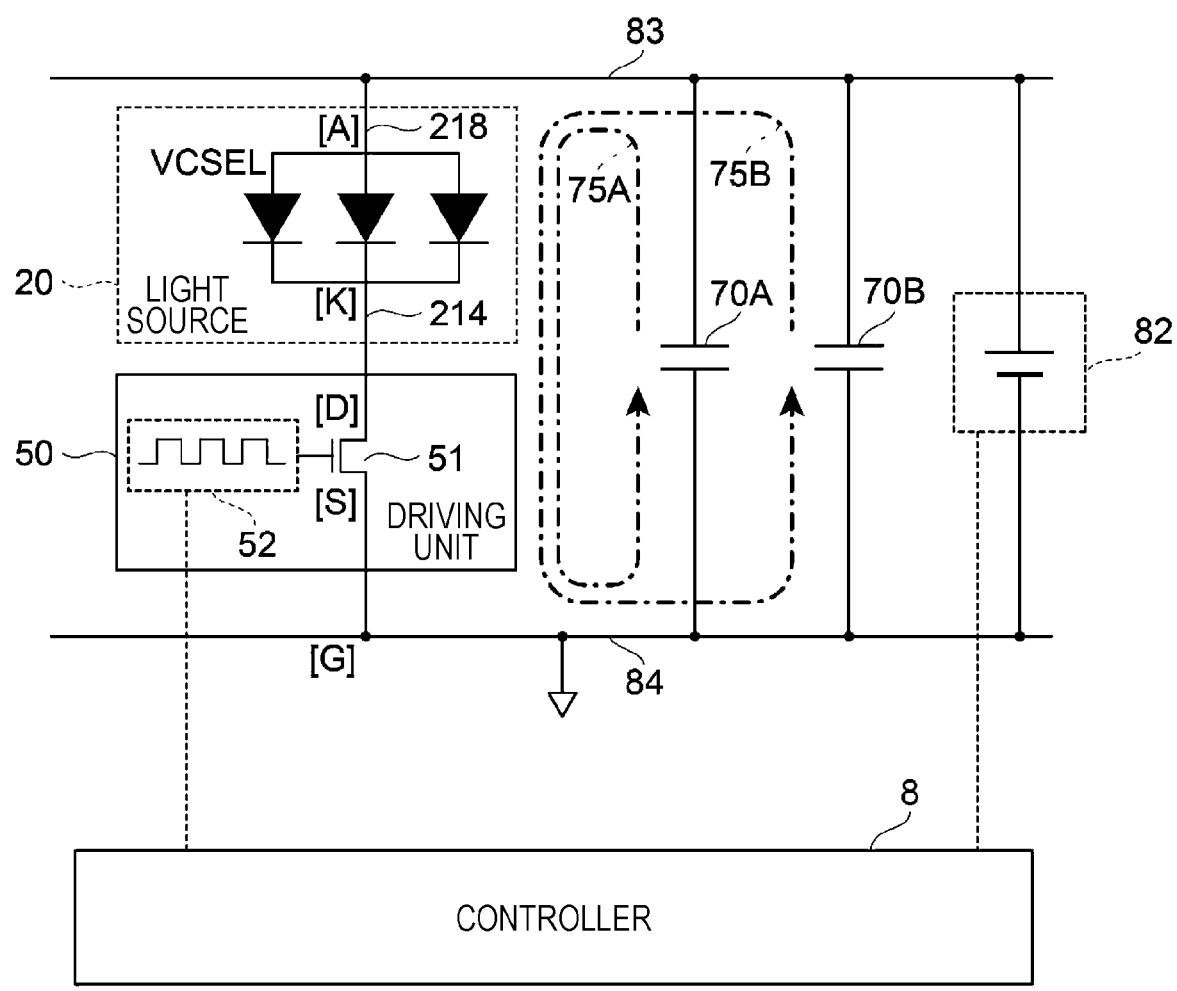
FIG. 5 illustrates an example of an equivalent circuit in a case where the light source is driven by low-side driving.

FIG. 5 illustrates an example of an equivalent circuit for driving the light source 20 by low-side driving. FIG. 5 illustrates VCSELs of the light source 20, the driving unit 50, the capacitors 70A and 70B, and a power source 82. The controller 8 illustrated in FIG. 1 is also illustrated in FIG. 5. The power source 82 is provided in the controller 8. The power source 82 generates a direct-current voltage whose + side is a power source potential and whose − side is a reference potential. The power source potential is supplied to a power source line 83, and the reference potential is supplied to a reference line 84. The reference potential may be a ground potential (also referred to as GND; indicated by "G" in FIG. 5).

The light source 20 is constituted by plural VCSELs that are connected in parallel, as described above. The anode electrode 218 (see FIG. 3; indicated by [A] in FIG. 5) of the VCSELs is connected to the power source line 83.

The driving unit 50 includes an n-channel MOS transistor 51 and a signal generating circuit 52 that turns the MOS transistor 51 on an off. A drain (indicated by [D] in FIG. 5) of the MOS transistor 51 is connected to the cathode electrode 214 (see FIG. 3; indicated by [K] in FIG. 5)) of the VCSELs. A source (indicated by [S] in FIG. 5) of the MOS transistor 51 is connected to the reference line 84. A gate of the MOS transistor 51 is connected to the signal generating circuit 52. That is, the VCSELs and the MOS transistor 51 of the driving unit 50 are connected in series between the power source line 83 and the reference line 84. The signal generating circuit 52 generates an "H level" signal that turns the MOS transistor 51 on and an "L level" signal that turns the MOS transistor 51 off under control of the controller 8.

One terminal of the capacitor 70A and one terminal of the capacitor 70B are connected to the power source line 83 ([A] of the VCSELs in FIG. 5), and the other terminal of the capacitor 70A and the other terminal of the capacitor 70B are connected to the reference line 84 ([G] in FIG. 5).

Next, a driving method for driving the light source 20 by low-side driving is described.

First, it is assumed that a signal generated by the signal generating circuit 52 of the driving unit 50 is an "L level". In this case, the MOS transistor 51 is in an off state. That is, no electric current flows between the source (indicated by [S] in FIG. 5) and the drain (indicated by [D] in FIG. 5) of the MOS transistor 51. Accordingly, no electric current flows through the VCSELs that are connected in series with the MOS transistor 51. That is, the VCSELs do not emit light.

In this state, the capacitors 70A and 70B are connected to the power source 82, the one terminal (a terminal on the [A] side of the VCSELs in FIG. 5) of the capacitor 70A and the one terminal (a terminal on the [A] side of the VCSELs in FIG. 5) of the capacitor 70B that are connected to the power source line 83 become a power source potential, and the other terminal (a terminal on the [G] side of the VCSELs in FIG. 5) of the capacitor 70A and the other terminal (a terminal on the [G] side of the VCSELs in FIG. 5) of the capacitor 70B that are connected to the reference line 84 become a reference potential. Accordingly, the capacitors 70A and 70B are charged with an electric current flowing (an electric charge supplied) from the power source 82.

Next, when the signal generated by the signal generating circuit 52 of the driving unit 50 becomes an "H level", the MOS transistor 51 shifts from an off state to an on state. As a result, the capacitors 70A and 70B, and the MOS transistor 51 and the VCSELs that are connected in series constitute a closed loop. This causes the electric charge accumulated in the capacitors 70A and 70B to be supplied to the VCSELs through the MOS transistor 51 that is connected in series with the VCSELs. That is, an electric current flows through the VCSELs, and the VCSELs emit light. This closed loop is an electric current path along which a driving electric current for causing the light source 20 to emit light is supplied. Since a driving electric current for causing the light source 20 to emit light is supplied to each of the capacitors 70A and 70B, the electric current path is provided for each of the capacitors 70A and 70B. Specifically, as illustrated in FIG. 5, a path along which an electric current flows from the capacitor 70A to the light source 20 is an electric current path 75A, and a path along which an electric current flows from the capacitor 70B to the light source 20 is an electric current path 75B. Supplying a driving electric current to the light source 20 is sometimes referred to as driving the light source 20.

Then, when the signal generated by the signal generating circuit 52 of the driving unit 50 becomes an "L level" again, the MOS transistor 51 shifts from an on state to an off state. This opens the closed loop constituted by the capacitors 70A and 70B, and the MOS transistor 51 and the VCSELs that are connected in series. As a result, an electric current does not flow through the VCSELs. Accordingly, the VCSELs stop light emission. The capacitors 70A and 70B are charged with an electric current flowing (an electric charge supplied) from the power source 82.

As described above, when the signal output by the signal generating circuit 52 repeatedly switches between the "L level" and the "H level", the MOS transistor 51 repeatedly turns on and off, and the VCSELs repeatedly switch between light emission and non-light-emission. The repeated on and off of the MOS transistor 51 is sometimes referred to as switching.

As described above, by discharging the electric charges accumulated in the capacitors 70A and 70B at once when the MOS transistor 51 is shifted from an off state to an on state, the driving electric current is supplied to the VCSELs.

The capacitors (the low-ESL capacitor and the non-low-ESL capacitor) are described below.

Figure 6A:
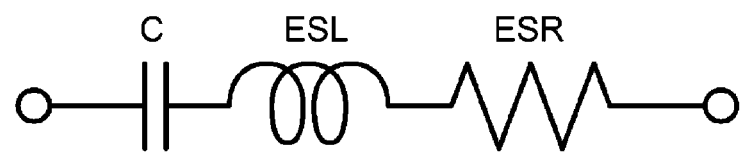
FIGS. 6A and 6B are views for explaining a capacitor.
Figure 6B:
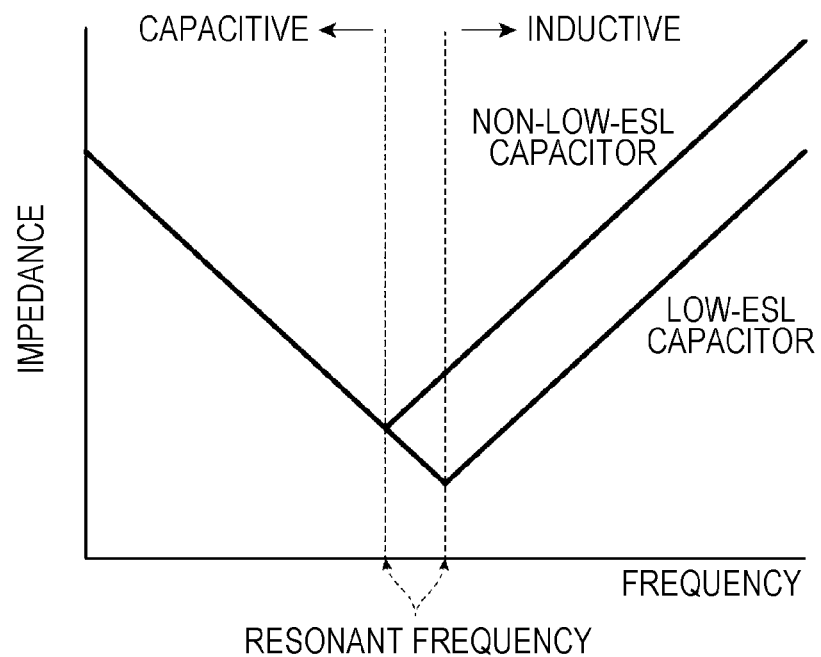

FIGS. 6A and 6B are views for explaining each of the capacitors. FIG. 6A illustrates an equivalent circuit of the capacitor, and FIG. 6B illustrates frequency characteristics of impedance of the capacitor. In FIG. 6B, the horizontal axis represents a frequency, and the vertical axis represents impedance.

As illustrated in FIG. 6A, the capacitor is expressed as an equivalent circuit constituted by capacitance C, equivalent series inductance ESL, and equivalent series resistance ESR that are connected in series.

As illustrated in FIG. 6B, in a case where the frequency is low, impedance of the capacitor is determined by the capacitance C. That is, the capacitor is capacitive, and the impedance thereof decreases as the frequency increases. Meanwhile, in a case where the frequency is high, the impedance of the capacitor is determined by the equivalent series inductance ESL. That is, the capacitor is inductive, and the impedance thereof increases as the frequency increases. Note that a frequency at which the capacitance C and the equivalent series inductance ESL have the same impedance is referred to as a resonant frequency.

To shorten a rise time of a driving electric current pulse supplied to the light source 20, impedance at a high frequency is desirably small, that is, the equivalent series inductance ESL is desirably small. That is, to shorten a rise time of a driving electric current pulse supplied to the light source 20, it is desirable to use a capacitor configured to reduce the equivalent series inductance ESL, that is, a low-ESL capacitor. As illustrated in FIG. 6B, the low-ESL capacitor has smaller impedance at a high frequency than a non-low-ESL capacitor having larger equivalent series inductance ESL than the low-ESL capacitor. As described above, the capacitor 70A is a low-ESL capacitor, and the capacitor 70B is a non-low-ESL capacitor.

Figure 7A:
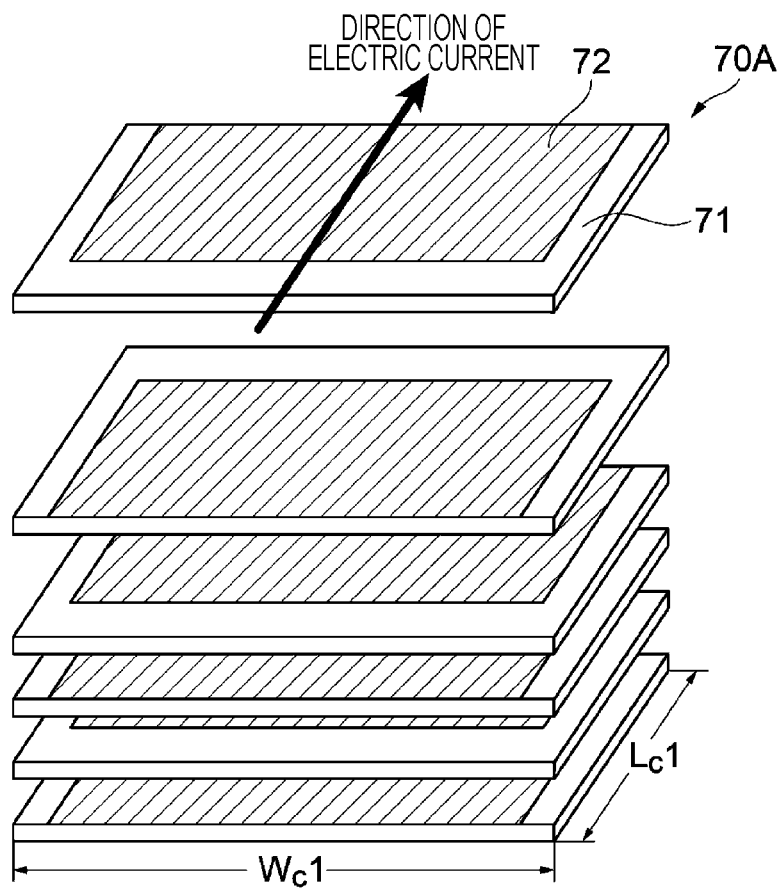
FIGS. 7A and 7B are views for explaining an example of a low-ESL capacitor and a non-low-ESL capacitor.
Figure 7B:
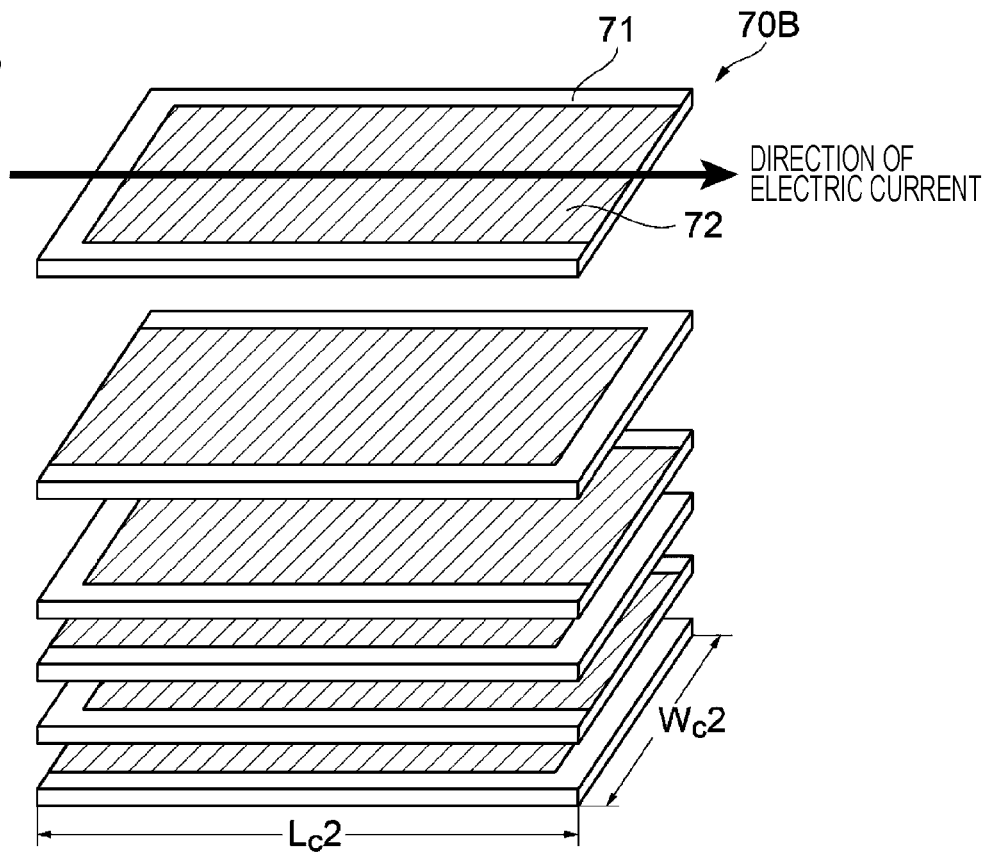

FIGS. 7A and 7B are views for explaining an example of the low-ESL capacitor (the capacitor 70A) and the non-low-ESL capacitor (the capacitor 70B). FIG. 7A illustrates the low-ESL capacitor (the capacitor 70A), and FIG. 7B illustrates the non-low-ESL capacitor (the capacitor 70B). These capacitors are laminated ceramic capacitors having two terminals. Each of these laminated ceramic capacitors has a multilayer structure including plural pairs of a ceramic sheet 71 having a quadrangular planar shape and made of a material such as titanium oxide or barium titanate and an internal wire 72 provided on a surface of the ceramic sheet 71, as illustrated in FIGS. 7A and 7B.

The capacitor 70A, which is a low-ESL capacitor, illustrated in FIG. 7A is configured such that an electric current flows in a short-side direction in the ceramic sheet 71 having a quadrangular planar shape. That is, the low-ESL capacitor has an electrode at both ends in the short-side direction and thus forms a laminated ceramic capacitor having two terminals. A length $L_c1$, which is a length of the ceramic sheet 71 in the direction (the short-side direction) in which an electric current flows, is shorter than a width $W_c1$, which is a width of the ceramic sheet 71 in a direction (longitudinal direction) orthogonal to the direction in which an electric current flows ($L_c1$ is shorter than $W_c1$). By thus making the electric current path in the low-ESL capacitor short, the equivalent series inductance ESL of the low-ESL capacitor is made smaller than that of the non-low-ESL capacitor described next. Such a low-ESL capacitor whose width $W_c1$ is longer than the length $L_c1$ is sometimes called a LW-reverse-type capacitor.

The capacitor 70B, which is a non-low-ESL capacitor, illustrated in FIG. 7B is configured such that an electric current flows in a longitudinal direction in the ceramic sheet 71 having a quadrangular planar shape. That is, the non-low-ESL capacitor has an electrode at both ends in the longitudinal direction and thus forms a laminated ceramic capacitor having two terminals. A length $L_c2$, which is a length of the ceramic sheet 71 in the direction (longitudinal direction) in which an electric current flows, is equal to or longer than a width $W_c2$, which is a width of the ceramic sheet 71 in a direction (short-side direction) orthogonal to the direction in which an electric current flows ($L_c2$ is equal to or longer than $W_c2$). Since the electric current path in the non-low-ESL capacitor is long, the equivalent series inductance ESL of the non-low-ESL capacitor is larger than the equivalent series inductance ESL of the low-ESL capacitor.

Use of the low-ESL capacitor having small equivalent series inductance ESL reduces impedance at a high frequency and shortens a rise time of a driving electric current pulse supplied to the light source 20.

However, the low-ESL capacitor often has a small rated capacity although a mount area thereof on the wiring board 10 is larger than a mount area of the non-low-ESL capacitor on the wiring board 10. Meanwhile, the non-low-ESL capacitor, which uses a ceramic sheet 71 of a high dielectric constant, often has a large rated capacity although a mount area thereof on the wiring board 10 is small. In view of this, the light-emitting device 4 to which the present exemplary embodiment is applied uses the capacitor 70A, which is a low-ESL capacitor, and the capacitor 70B, which is a non-low-ESL capacitor, in combination. That is, a mount area of the capacitor 70A on the wiring board 10 is larger than a mount area of the capacitor 70B on the wiring board 10.

Figure 8:
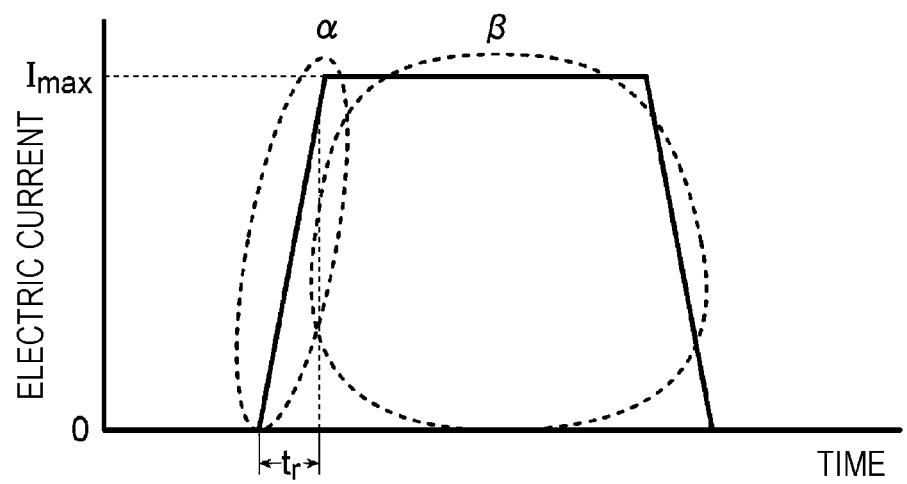
FIG. 8 is a view for explaining a driving electric current pulse supplied to the light source.

FIG. 8 is a view for explaining a driving electric current pulse supplied to the light source 20. In FIG. 8, the horizontal axis represents a time, and the vertical axis represents an electric current.

As illustrated in FIG. 8, a period it takes for the driving electric current pulse to increase from an electric current value "0" to 90% of a maximum electric current value "$I_{max}$" is referred to as a rise time $t_r$. In the light-emitting device 4 to which the present exemplary embodiment is applied, a rising part α during the rise time $t_r$ of the driving electric current pulse is supplied by the capacitor 70A, which is a low-ESL capacitor. Meanwhile, a part that supplies the driving electric current is supplied by the capacitor 70B, which is a non-low-ESL capacitor.

Light-Emitting Device 4

Next, the light-emitting device 4 is described in detail.

Figure 9A:
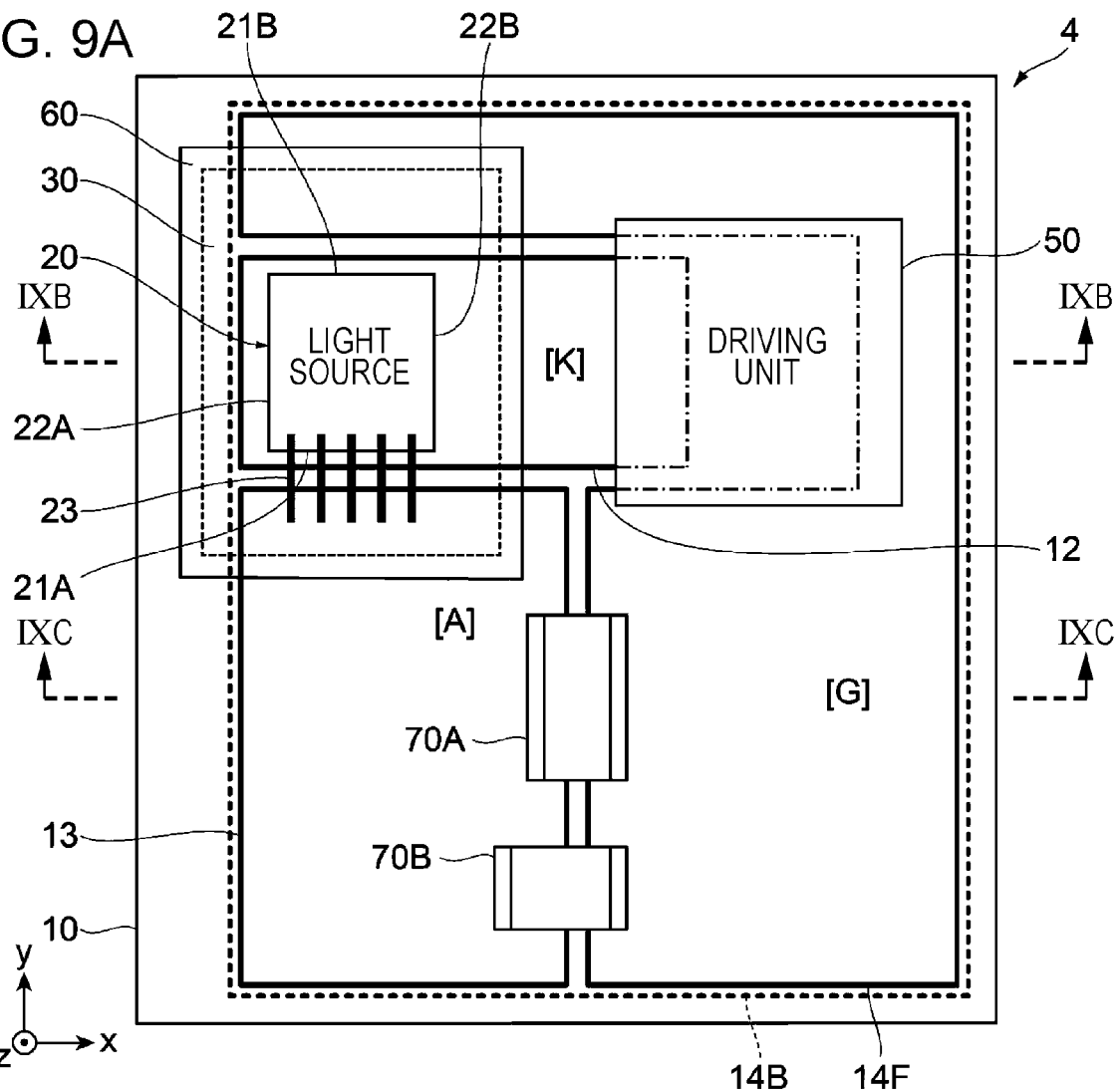
FIGS. 9A through 9C are views for explaining a light-emitting device to which the present exemplary embodiment is applied.
Figure 9B:
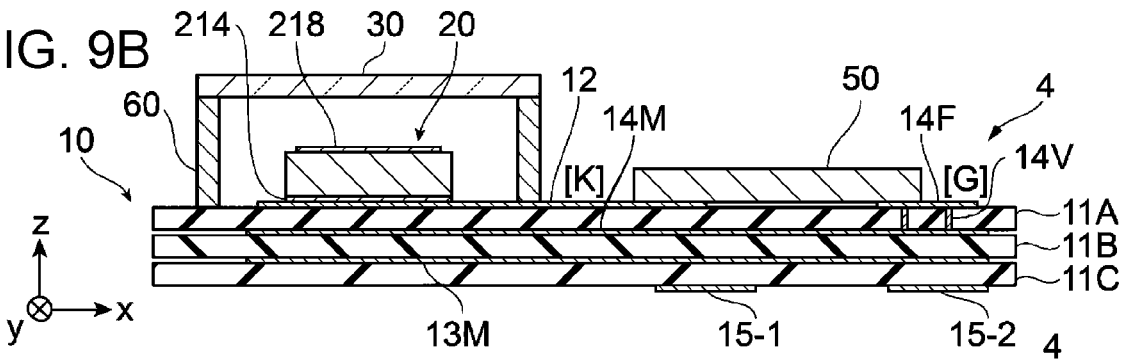
Figure 9C:
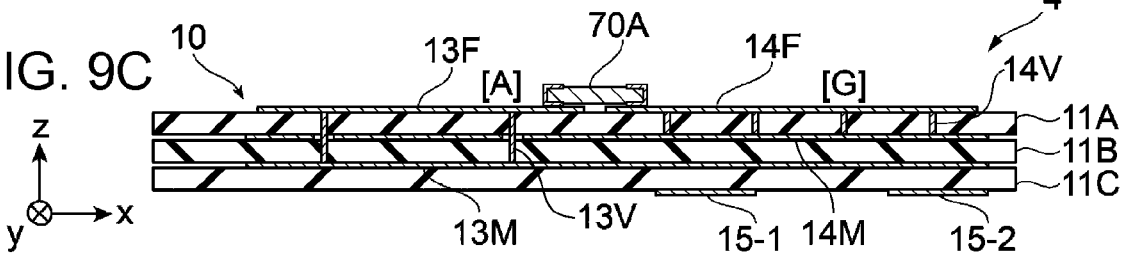

FIGS. 9A and 9B are views for explaining the light-emitting device 4 to which the first exemplary embodiment is applied. FIG. 9A is a plan view, FIG. 9B is a cross-sectional view taken along line IXB-IXB of FIG. 9A, and FIG. 9C is a cross-sectional view taken along line IXC-IXC. FIG. 9A is a view of the light-emitting device 4 seen through the light diffusion member 30. In FIG. 9A, it is assumed that the rightward direction and the upward direction of the paper on which FIG. 9A is drawn are the x direction and the y direction, respectively. It is assumed that a direction (frontward direction of the paper on which FIG. 9A is drawn) orthogonal to the x direction and the y direction in anti-clockwise direction is the z direction. As for the members described below (such as the wiring board 10 and the light diffusion member 30), a front side (+z direction) of the paper is referred to as a front surface or a front surface side, and a rear side (−z direction) of the paper is referred to as a rear surface or a rear surface side. Seeing through the members from the front surface side is referred to as top view. In FIGS. 9B and 9C, the rightward direction of the paper is the x direction, the rearward direction of the paper is the y direction, and the upward direction of the paper is the z direction.

As illustrated in FIGS. 9A and 9B, the light source 20, the driving unit 50, the capacitors 70A and 70B, and the holding unit 60 are provided on the front surface of the wiring board 10. The light diffusion member 30 is provided on the holding unit 60.

The wiring board 10 is, for example, configured such that a wiring layer in which wires made of a metal such as a copper (Cu) foil are provided is provided on an insulating base member (hereinafter sometimes referred to as an insulating layer) made of a material such as a glass epoxy resin. Note that the wires are conductive patterns connected to an electric circuit, and a shape thereof is not limited. It is assumed here that the wiring board 10 is a printed wiring board having four wiring layers. Examples of the base member made of a material such as a glass epoxy resin include glass composite substrate (CEM-3) and a glass epoxy substrate (FR-4).

In the light-emitting device 4, the light source 20 and the driving unit 50 are aligned in the x direction on the wiring board 10, as illustrated in FIG. 9A.

The holding unit 60 includes walls that are provided so as to surround the light source 20 (edges of the walls on the light source 20 side are indicated by the broken line in FIG. 9A). The holding unit 60 holds the light diffusion member 30 by these walls, as illustrated in FIG. 9B. That is, the light diffusion member 30 is provided so as to be spaced apart by a predetermined distance from the light source 20 provided on the wiring board 10 by the holding unit 60. The light diffusion member 30 is provided so as to cover the light source 20. Covering the light source 20 with the light diffusion member 30 means that the light diffusion member 30 is provided on an emission path of light emitted by the light source 20 so that the light emitted by the light source 20 passes through the light diffusion member 30. This state is a state in which the light source 20 and the light diffusion member 30 overlap each other in top view viewed from the front surface side of the light diffusion member 30.

The holding unit 60 is, for example, a member that is molded from a material such as a resin. The holding unit 60 is desirably colored, for example, in black to absorb light emitted from the light source 20. As a result, light emitted toward the holding unit 60 by the light source 20 is absorbed by the holding unit 60. This keeps the object to be measured from being irradiated with light that has passed through the holding unit 60 and light reflected by the holding unit 60.

As illustrated in FIGS. 9B and 9C, the wiring board 10 includes a first wiring layer, a second wiring layer, a third wiring layer, and a fourth wiring layer in this order from the front surface side (+z direction side) of the wiring board 10. The first wiring layer and the second wiring layer are insulated from each other by an insulating layer 11A, the second wiring layer and the third wiring layer are insulated from each other by an insulating layer 11B, and a third wiring layer and a fourth wiring layer are insulated from each other by an insulating layer 11C. In a case where the insulating layers 11A, 11B, and 11C are not distinguished from one another, the insulating layers 11A, 11B, and 11C are referred to as insulating layers 11.

In the first wiring layer, a cathode wire 12, an anode wire 13F, and a reference potential wire 14F that are electrically separate from one another are provided. In FIG. 9A, portions of the cathode wire 12 and the reference potential wire 14F hidden by the driving unit 50 are indicated by the line with alternate long and short dashes.

In the second wiring layer, a reference potential wire 14M is provided. The reference potential wire 14M is provided on the entire surface of the wiring board 10, as indicated by the broken line in FIG. 9A. The cathode wire 12, the anode wire 13F, and the reference potential wire 14F are provided so as to overlap the reference potential wire 14M in plan view. In FIG. 9A, edges of the cathode wire 12, the anode wire 13F, and the reference potential wire 14F are within edges of the reference potential wire 14M. Note, however, that the edges of the cathode wire 12, the anode wire 13F, and the reference potential wire 14F need not be within the edges of the reference potential wire 14M.

In the third wiring layer, a power source potential wire 13M is provided. The power source potential wire 13M may be provided on the entire surface of the wiring board 10 in the same manner as the reference potential wire 14M or may be provided on a part of the wiring board 10 so as to be connected to the anode wire 13F.

As illustrated in FIGS. 9A and 9B, the cathode wire 12 in the first wiring layer has a quadrangular planar shape and is provided so as to connect the light source 20 and the driving unit 50. The light source 20 is provided on one end (on a −x direction side) of the cathode wire 12. That is, the light source 20 (VCSELs) is provided on the cathode wire 12 so that the cathode wire 12 and the cathode electrode 214 of the VCSELs that constitute the light source 20 make contact with each other. The other end (on a +x direction side) of the cathode wire 12 is connected to the driving unit 50 so as to be connected to the drain (see [D] in FIG. 5) of the MOS transistor 51 of the driving unit 50.

The anode wire 13F in the first wiring layer has a quadrangular planar shape and is provided on a side surface 21A (−y direction) side of the light source 20. The anode electrode 218 (see FIGS. 2 and 3) of the VCSELs that constitute the light source 20 and the anode wire 13F are connected to each other by a bonding wire 23 on the side surface 21A side of the light source 20. The anode wire 13F is connected to one terminal (−x direction side) of the capacitor 70A and one terminal (−x direction side) of the capacitor 70B.

The reference potential wire 14F in the first wiring layer is provided in a part where the cathode wire 12 and the anode wire 13F are not provided. In this example, the reference potential wire 14F is provided in an L-shape on the +x direction side and the +y direction side of the wiring board 10, as illustrated in FIG. 9A. The reference potential wire 14F is connected to the driving unit 50 so as to be connected to the source (see [S] in FIG. 5) of the MOS transistor 51 of the driving unit 50.

As illustrated in FIGS. 9B and 9C, the reference potential wire 14F in the first wiring layer and the reference potential wire 14M in the second wiring layer are connected to each other by a through conductor 14V provided in the insulating layer 11A. A through conductor is obtained by filling a through hole formed through the insulating layer 11 with a material such as copper (Cu) and electrically connects a wire provided on a front surface side of the insulating layer 11 and a wire provided on a rear surface side of the insulating layer 11. Note that the through conductor is also called a via.

The anode wire 13F in the first wiring layer and the power source potential wire 13M in the third wiring layer are connected to each other by a through conductor 13V provided in the insulating layer 11A and the insulating layer 11B. The through conductor 13V is electrically separate from the reference potential wire 14M in the second wiring layer.

Figure 10:
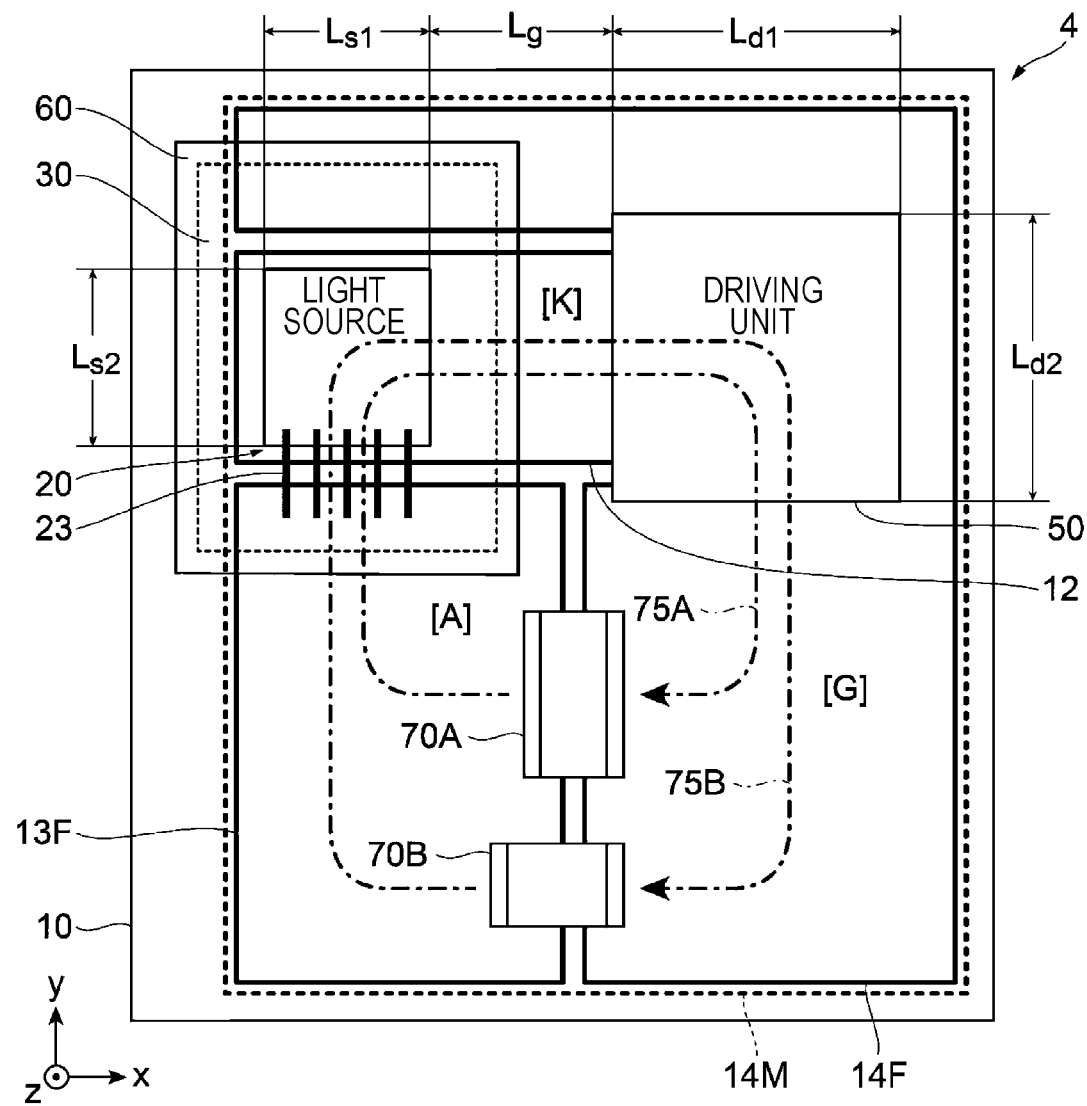
FIG. 10 is a view for explaining electric current paths for driving the light source in the light-emitting device.

FIG. 10 is a view for explaining an electric current path for driving the light source 20 in the light-emitting device 4. The light-emitting device 4 illustrated in FIG. 10 is identical to the plan view of the light-emitting device 4 illustrated in FIG. 9A.

As illustrated in FIG. 2, the planar shape of the light source 20 has the length $L_s1$ in the x direction and the length $L_s2$ in the y direction. The driving unit 50 has a quadrangular planar shape and has a length $L_d1$ in the x direction and a length $L_d2$ in the y direction. The planar shape of the driving unit 50 may be a square shape whose lengths $L_d1$ and the $L_d2$ are the same or may be a rectangular shape whose lengths $L_d1$ and the $L_d2$ are different. The lengths $L_d1$ and $L_d2$ of the driving unit 50 are, for example, 1 mm to 5 mm (e.g., 2 mm). The light source 20 and the driving unit 50 are spaced apart by a distance $L_g$ from each other. Note that the planar shape of the driving unit 50 may be a shape other than a quadrangular shape.

An electric current path 75A along which a driving electric current flows from the capacitor 70A to the light source 20 passes one terminal of the capacitor 70A, the anode wire 13F, the bonding wire 23, the light source 20, the cathode wire 12, the driving unit 50, the reference potential wire 14F, and the other terminal of the capacitor 70A in this order, as indicated by the line with alternate long and short dashes in FIG. 10. Similarly, an electric current path 75B along which a driving electric current flows from the capacitor 70B to the light source 20 passes one terminal of the capacitor 70B, the anode wire 13F, the bonding wire 23, the light source 20, the cathode wire 12, the driving unit 50, the reference potential wire 14F, and the other terminal of the capacitor 70B in this order, as indicated by the line with alternate long and short dashes in FIG. 10. The electric current path 75A is an example of a first electric current path, and the electric current path 75B is an example of a second electric current path.

To shorten the electric current paths 75A and 75B so that inductance thereof is reduced, it is desirable to shorten the distance $L_g$ between the light source 20 and the driving unit 50. The distance $L_g$ between the light source 20 and the driving unit 50 is desirably equal to or shorter than a length that is two times longer than a length (the length $L_s1$ and the length $L_s2$) of one side of the light source 20. Alternatively, the distance $L_g$ between the light source 20 and the driving unit 50 is desirably equal to or shorter than a length that is two times longer than a length (the length $L_d1$ and the length $L_d2$) of one side of the driving unit 50. Alternatively, the distance $L_g$ between the light source 20 and the driving unit 50 is desirably equal to or shorter than a length that is two times longer than a length (the length $L_s1$ and the length $L_s2$) of one side of the light source 20 and equal to or shorter than a length that is two times longer than a length (the length $L_d1$ and the length $L_d2$) of one side of the driving unit 50. In a case where the distance $L_g$ between the light source 20 and the driving unit 50 is long, contribution of inductance of the cathode wire 12 and the reference potential wire 14M between the light source 20 and the driving unit 50 becomes large, thereby reducing the advantage of use of the low-ESL capacitor. That is, as the distance $L_g$ between the light source 20 and the driving unit 50 becomes shorter, the advantage of use of the low-ESL capacitor becomes greater. Specifically, as the distance $L_g$ between the light source 20 and the driving unit 50 becomes shorter, inductance on the electric current path between the light source 20 and the driving unit 50 becomes smaller, and the rise time $t_r$ of the driving electric current pulse becomes shorter accordingly. The distance $L_g$ between the light source 20 and the driving unit 50 is, for example, 0.1 mm to 5 mm (e.g., 0.5 mm).

Figure 11:
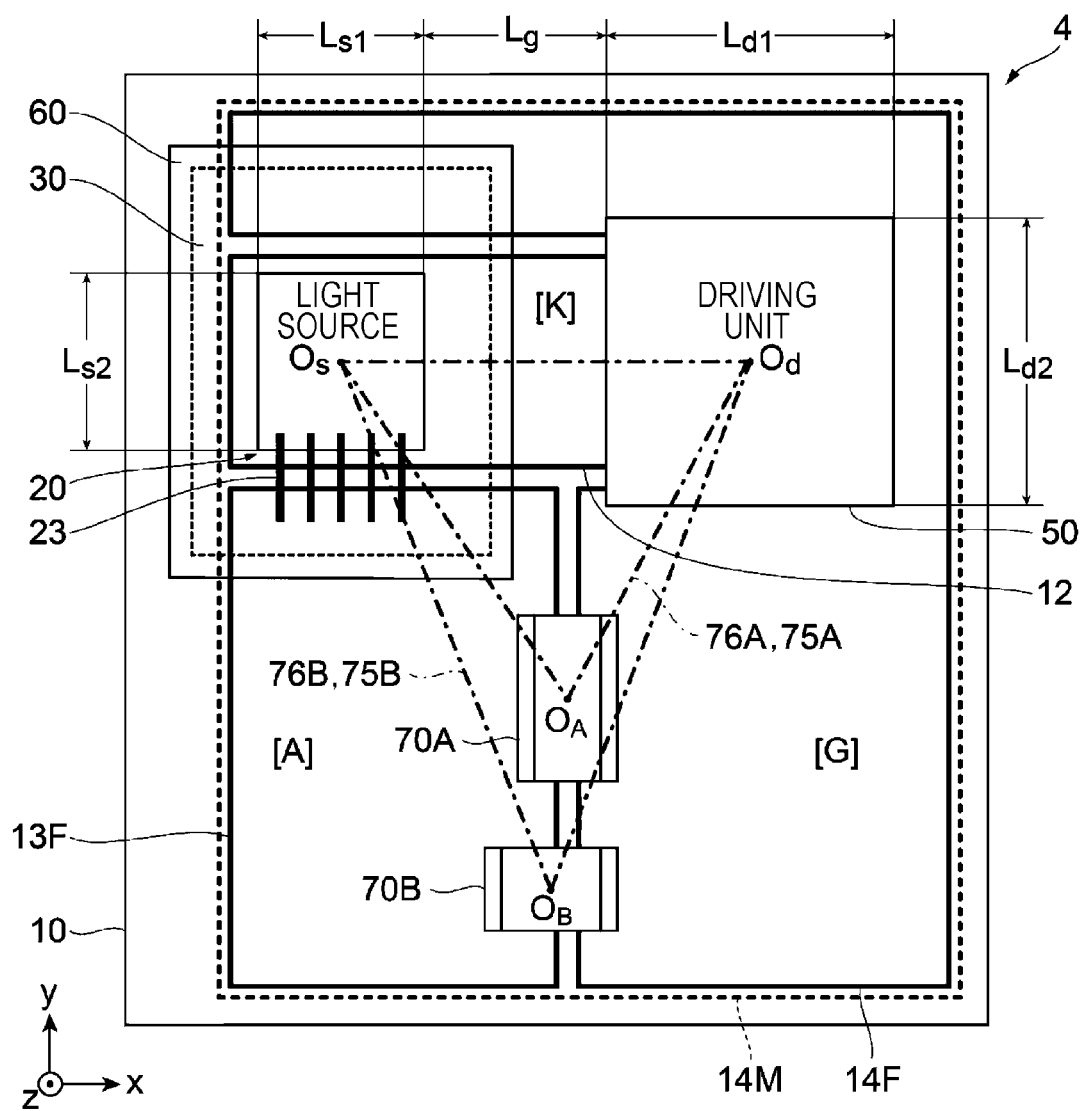
FIG. 11 is a view for explaining lengths of electric current paths for driving the light source in the light-emitting device.

FIG. 11 is a view for explaining lengths of electric current paths for driving the light source 20 in the light-emitting device 4. A length of an electric current path is referred to as an electric current path length. FIG. 11 is a view for explaining electric current path lengths 76A and 76B of the electric current paths 75A and 75B in FIG. 10.

As illustrated in FIG. 11, the electric current path length 76A of the electric current path 75A from the capacitor 70A to the capacitor 70A is defined as a line connecting the center $O_s$ of the light source 20, the center Od of the driving unit 50, and the center $O_A$ of the capacitor 70A. Similarly, the electric current path length 76B of the electric current path 75B from the capacitor 70B to the capacitor 70B is defined as a line connecting the center $O_s$ of the light source 20, the center Od of the driving unit 50, and the center OB of the capacitor 70B. That is, the electric current path lengths 76A and 76B are shortest paths through which an electric current flows. The electric current path length 76A is an example of a first electric current path length, and the electric current path length 76B is an example of a second electric current path length.

The capacitor 70A, which is a low-ESL capacitor, is disposed closer to the light source 20 and the driving unit 50 than the capacitor 70B, which is a non-low-ESL capacitor. Accordingly, the electric current path length 76A of the capacitor 70A is shorter than the electric current path length 76B of the capacitor 70B. Both of the electric current path lengths 76A and 76B are desirably short. As an electric current path length becomes shorter, inductance of the electric current path becomes smaller, and a rise time $t_r$ of a driving electric current becomes shorter. However, in a case where there is a difference in electric current path length, the advantage of use of a low-ESL capacitor as a capacitor of a shorter electric current path length becomes greater as the difference in electric current path length becomes greater. For example, the electric current path length 76B of the capacitor 70B may be equal to or longer than a length that is 1.2 times longer than the electric current path length 76A of the capacitor 70A.

The capacitor 70A, which is a low-ESL capacitor, may be disposed closer to either the light source 20 or the driving unit 50 than the capacitor 70B, which is a non-low-ESL capacitor. In this case, the capacitor 70A, which is a low-ESL capacitor, is desirably disposed closer to the light source 20 than the capacitor 70B, which is a non-low-ESL capacitor. In a case where the capacitor 70A is disposed close to the light source 20, the distance from the capacitor 70A to the light source 20 becomes shorter and inductance from the capacitor 70A to the light source 20 becomes smaller than in a case where the capacitor 70A is disposed close to the driving unit 50.

Figure 12:
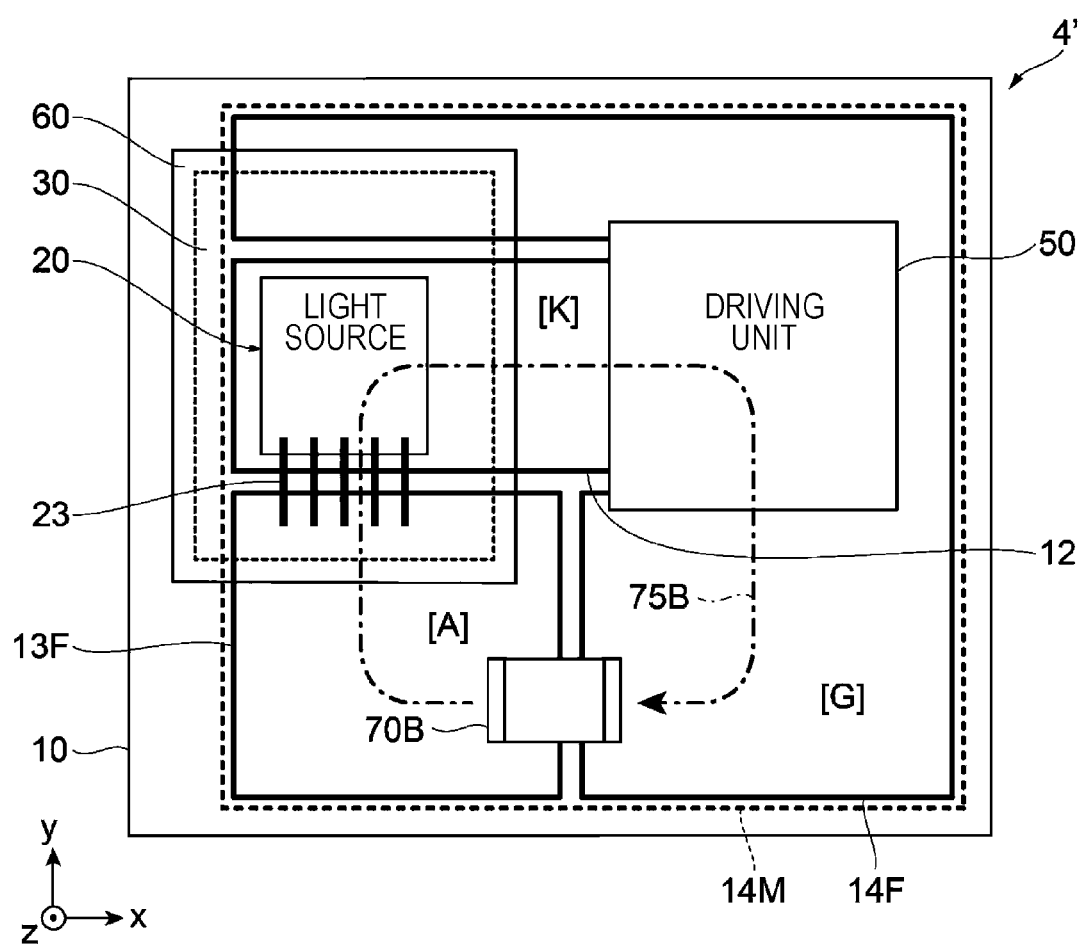
FIG. 12 is a view for explaining a light-emitting device for comparison.

FIG. 12 is a view for explaining a light-emitting device 4' for comparison. The light-emitting device 4' does not use the capacitor 70A, which is a low-ESL capacitor, and uses only the capacitor 70B, which is a non-low-ESL capacitor. That is, the light-emitting device 4' uses only one kind of capacitor. Except for this, the light-emitting device 4' is identical to the light-emitting device 4 illustrated in FIG. 9, and identical parts are given identical reference signs, and description thereof is omitted.

As described above, the non-low-ESL capacitor uses the ceramic sheet 71 of a high dielectric constant and often has a large rated capacity although a mount area thereof on the wiring board 10 is small. For example, only one non-low-ESL capacitor is necessary to drive the light source 20 of approximately 2 W. This reduces the size of the wiring board 10, thereby allowing a reduction in sizes of devices such as the light-emitting device 4 and the optical device 3. However, the non-low-ESL capacitor has larger equivalent series inductance ESL than the low-ESL capacitor, and it is therefore hard for the non-low-ESL capacitor to supply an electric current corresponding to the rising part α of the driving electric current pulse illustrated in FIG. 8.

Figure 13:
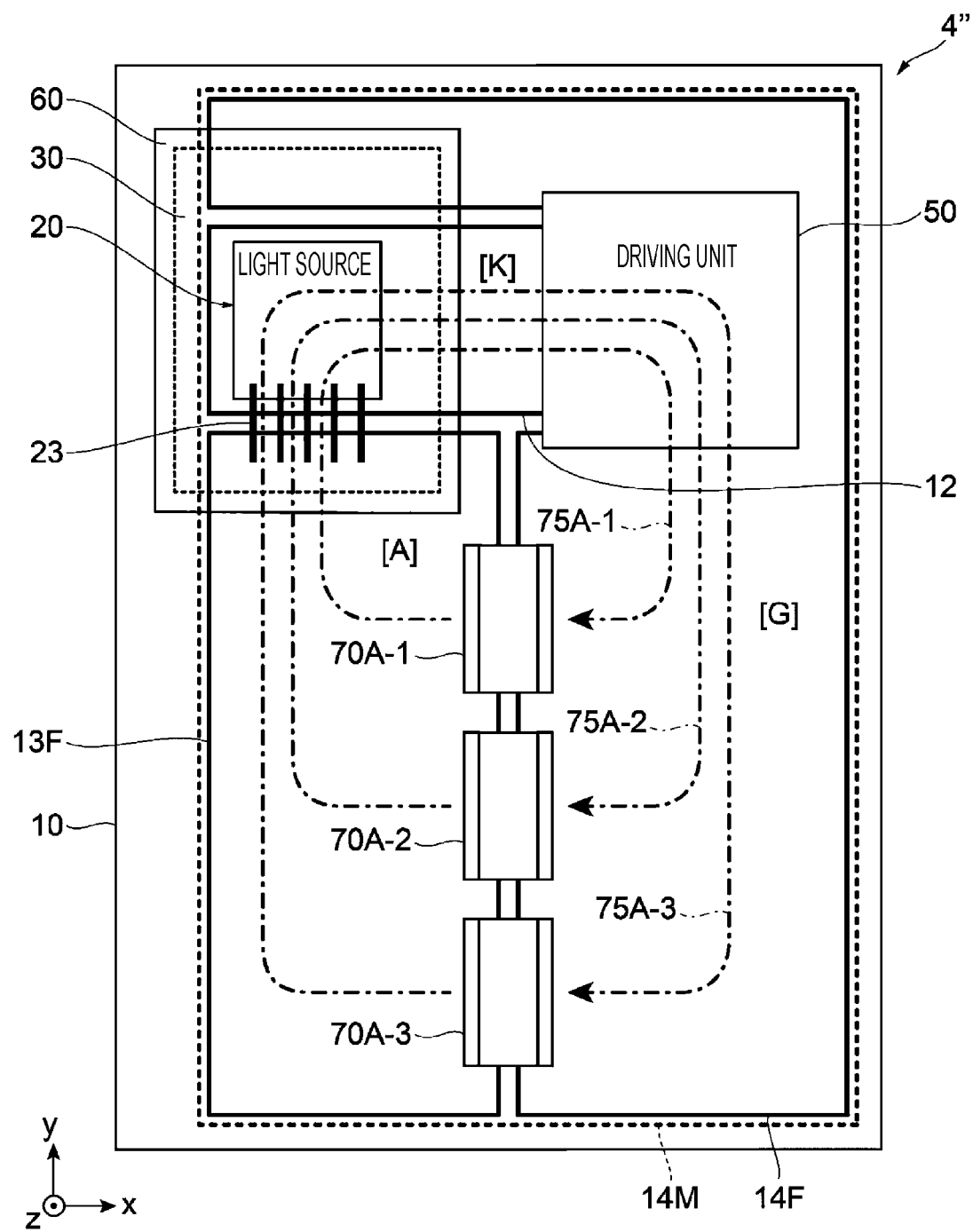
FIG. 13 is a view for explaining another light-emitting device for comparison.

FIG. 13 is a view for explaining another light-emitting device 4" for comparison. The light-emitting device 4" does not use the capacitor 70B, which is a non-low-ESL capacitor, and uses only the capacitor 70A, which is a low-ESL capacitor. That is, the light-emitting device 4" uses only one kind of capacitor. Except for this, the light-emitting device 4" is identical to the light-emitting device 4 illustrated in FIG. 9, and identical parts are given identical reference signs, and description thereof is omitted.

As described above, the low-ESL capacitor often has a small rated capacity although a mount area thereof on the wiring board 10 is large. Accordingly, in a case where the capacitor 70A, which is a low-ESL capacitor, is used without using the capacitor 70B, which is a non-low-ESL capacitor, plural capacitors 70A are needed to drive, for example, the light source 20 of approximately 2 W. As illustrated in FIG. 13, three capacitors 70A-1, 70A-2, and 70A-3 are used in the light-emitting device 4". In this case, electric current paths 75A-1, 75A-2, and 75A-3 are provided for the capacitors 70A-1, 70A-2, and 70A-3, respectively. The electric current paths 75A-2 and 75A-3 have electric current path lengths that are longer than an electric current path length of the electric current path 75A-1 and therefore has large inductance. Therefore, the advantage of using the low-ESL capacitor to reduce inductance is small. Furthermore, in a case where the plural low-ESL capacitors (the capacitors 70A-1, 70A-2, and 70A-3) are used, mount areas thereof on the wiring board 10 are large, and it is therefore difficult to achieve a reduction in sizes of devices such as the light-emitting device 4 and the optical device 3.

In view of this, in the light-emitting device 4 to which the present exemplary embodiment is applied, different kinds of capacitors, specifically, the capacitor 70A, which is a low-ESL capacitor, and the capacitor 70B, which is a non-low-ESL capacitor, are used to shorten a rise time $t_r$ of a driving electric current pulse, and mount areas of the capacitors 70A and 70B on the wiring board 10 are reduced to achieve a reduction in sizes of devices such as the light-emitting device 4 and the optical device 3. That is, the light-emitting device 4 achieves both an increase in rising speed of a driving electric current and a reduction in sizes of devices.

Light output of the light source 20 in the light-emitting device 4 is 2 W to 4 W. Such a large-output light source 20 generates a large amount of heat. Accordingly, it is required to efficiently release heat from the light source 20. In view of this, the light source 20 may be provided on an insulating heat releasing base member having higher thermal conductivity than the wiring board 10, and the heat releasing base member may be provided on the wiring board 10. Note that an insulating layer called FR-4 used for the wiring board 10 has thermal conductivity of approximately 0.4 W/m·K. Accordingly, the thermal conductivity of the heat releasing base member is preferably 10 W/m·K or more, more preferably 50 W/m·K or more, still more preferably 100 W/m·K or more. A material having thermal conductivity of 10 W/m·K or more is, for example, alumina ($Al_2O_3$) having thermal conductivity of 20 W/m·K to 30 W/m·K. A material having thermal conductivity of 50 W/m·K or more is, for example, silicon nitride ($Si_3N_4$) having thermal conductivity of approximately 85 W/m·K. A material having thermal conductivity of 100 W/m·K or more is, for example, aluminum nitride (AlN) having thermal conductivity of 150 W/m·K to 250 W/m·K. These materials are sometimes referred to as ceramic materials. The whole heat releasing base member is desirably made of a ceramic material. The heat releasing base member may be made of an insulating material of other kinds having high thermal conductivity such as silicon (Si) doped with no impurity.

Although the light source 20 and the driving unit 50 are provided on the front surface of the wiring board 10 in the light-emitting device 4 to which the present exemplary embodiment is applied, the light source 20 and the driving unit 50 may be provided on different circuit boards that are connected, for example, by a flexible flat cable (FFC) or a flexible printed circuit (FPC).

In the light-emitting device 4 to which the present exemplary embodiment is applied, the light diffusion member 30 for outputting incident light after changing a spread angle of the incident light to a larger angle by diffusion is used as an example of an optical member. The optical member may be, for example, a diffractive optical element (DOE) for outputting incident light after changing a direction of the incident light to a different direction. Alternatively, the optical member may be a transparent member such as a light focusing lens, a microlens, or a protection cover.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A light-emitting device comprising:
   a laser unit; and
   a first capacitive element and a second capacitive element that supply a driving electric current to the laser unit;
   wherein
   the first capacitive element has smaller equivalent series inductance than the second capacitive element, and
   the second capacitive element has a larger capacity and a smaller mount area than the first capacitive element.

2. The light-emitting device according to claim 1, wherein a length of a first electric current path along which the driving electric current output from the first capacitive element and supplied to the laser unit returns to the first capacitive element is shorter than a length of a second electric current path along which the driving electric current output from the second capacitive element and supplied to the laser unit returns to the second capacitive element.

3. The light-emitting device according to claim 2, wherein the length of the second electric current path is equal to or longer than a length that is 1.2 times longer than the length of the first electric current path.

4. The light-emitting device according to claim 3, wherein the first capacitive element is disposed closer to the laser unit than the second capacitive element.

5. The light-emitting device according to claim 3, further comprising a driving unit that drives the laser unit,
   wherein the first capacitive element is disposed closer to the laser unit and the driving unit than the second capacitive element.

6. The light-emitting device according to claim 3, further comprising a driving unit that drives the laser unit,
   wherein
   the laser unit and the driving unit are quadrangular, and
   a distance between the laser unit and the driving unit is equal to or shorter than a length that is two times longer than a length of one side of the laser unit or a length of one side of the driving unit.

7. The light-emitting device according to claim 3, wherein the laser unit is a surface emitting laser element array constituted by a plurality of surface emitting laser elements provided on a common semiconductor substrate.

8. The light-emitting device according to claim 2, wherein the first capacitive element is disposed closer to the laser unit than the second capacitive element.

9. The light-emitting device according to claim 8, wherein the laser unit is a surface emitting laser element array constituted by a plurality of surface emitting laser elements provided on a common semiconductor substrate.

10. The light-emitting device according to claim 2, further comprising a driving unit that drives the laser unit,
wherein the first capacitive element is disposed closer to the laser unit and the driving unit than the second capacitive element.

11. The light-emitting device according to claim 2, further comprising a driving unit that drives the laser unit,
wherein
the laser unit and the driving unit are quadrangular, and
a distance between the laser unit and the driving unit is equal to or shorter than a length that is two times longer than a length of one side of the laser unit or a length of one side of the driving unit.

12. The light-emitting device according to claim 2, wherein
the laser unit is a surface emitting laser element array constituted by a plurality of surface emitting laser elements provided on a common semiconductor substrate.

13. The light-emitting device according to claim 1, wherein
the first capacitive element is disposed closer to the laser unit than the second capacitive element.

14. The light-emitting device according to claim 13, wherein
the laser unit is a surface emitting laser element array constituted by a plurality of surface emitting laser elements provided on a common semiconductor substrate.

15. The light-emitting device according to claim 1, further comprising a driving unit that drives the laser unit,
wherein the first capacitive element is disposed closer to the laser unit and the driving unit than the second capacitive element.

16. The light-emitting device according to claim 1, further comprising a driving unit that drives the laser unit,
wherein
the laser unit and the driving unit are quadrangular, and
a distance between the laser unit and the driving unit is equal to or shorter than a length that is two times longer than a length of one side of the laser unit or a length of one side of the driving unit.

17. The light-emitting device according to claim 1, wherein
the laser unit is a surface emitting laser element array constituted by a plurality of surface emitting laser elements provided on a common semiconductor substrate.

18. The light-emitting device according to claim 1, further comprising an optical member that changes at least one of a direction and a spread angle of light emitted from the laser unit.

19. An optical device comprising:
the light-emitting device according to claim 1; and
a light receiving unit that receives light emitted from the laser unit of the light-emitting device and then reflected by an object to be measured,
wherein the light receiving unit outputs a signal corresponding to a period from the emission of the light from the laser unit to the reception of the light by the light receiving unit.

20. A measurement device comprising:
the optical device according to claim 19; and
a three-dimensional shape specifying unit that specifies a three-dimensional shape of an object to be measured based on light emitted from the laser unit of the optical device, reflected by the object to be measured, and then received by the light receiving unit of the optical device.

* * * * *